United States Patent
Wang et al.

(10) Patent No.: US 6,339,007 B1
(45) Date of Patent: Jan. 15, 2002

(54) CAPACITOR STACK STRUCTURE AND METHOD OF FABRICATING DESCRIPTION

(75) Inventors: Yun-Yu Wang, Poughquag; Rajarao Jammy, Wappinger Falls; Lee J. Kimball, Newburgh, all of NY (US); David E. Kotecki, Orono, ME (US); Jenny Lian, Wallkill, NY (US); Chenting Lin, Poughkeepsie, NY (US); John A. Miller, Newburgh, NY (US); Nicholas Nagel, Munich (DE); Hua Shen, San Jose, CA (US); Horatio S. Wildman, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/562,556

(22) Filed: May 2, 2000

(51) Int. Cl.[7] .............................................. H01L 21/20
(52) U.S. Cl. ...................................... 438/393; 257/303
(58) Field of Search ................................. 438/393, 396, 438/397, 253, 254, 256, 257; 257/303, 306, 310

(56) References Cited

U.S. PATENT DOCUMENTS

| | | | |
|---|---|---|---|
| 5,343,062 A | * 8/1994 | Tomioka | 257/297 |
| 5,585,998 A | 12/1996 | Kotecki et al. | 361/321.4 |
| 5,621,606 A | 4/1997 | Hwang | 361/321.4 |
| 5,696,015 A | 12/1997 | Hwang | 437/52 |
| 5,717,236 A | * 2/1998 | Shinkawata | 257/306 |
| 5,825,609 A | 10/1998 | Andricacos et al. | 361/321.4 |
| 5,844,771 A | 12/1998 | Graettinger et al. | 361/303 |
| 5,892,254 A | 4/1999 | Park et al. | 257/295 |
| 6,180,974 B1 | * 1/2001 | Okutoh et al. | 257/306 |

OTHER PUBLICATIONS

Kotecki et al, (Ba,Sr) TiO$_3$ dielectrics for furture stacked–capacitor DRAM, *IBM J. Res. Develop.*, vol. 43, No. 3, May 1999: 367–382.

* cited by examiner

*Primary Examiner*—David Nelms
*Assistant Examiner*—Quoc Hoang
(74) *Attorney, Agent, or Firm*—Connolly Bove Lodge & Hutz; H. Daniel Schnurmann (57) ABSTRACT

A capacitor structure that comprises a top platinum electrode and a bottom electrode having insulator on the sidewalls of the electrodes, and wherein the bottom electrode is from depositing a first electrode portion being recessed with respect to the insulator on the sidewalls thereof and depositing a second insulator portion is provided.

15 Claims, 8 Drawing Sheets

CAPACITOR STACK STRUCTURE AND METHOD OF FABRICATING DESCRIPTION

DESCRIPTION

1. Technical Field

The present invention relates to capacitors and more particularly to a stacked capacitor. The capacitors of the present invention are especially suitable for high density dynamic random-access memory devices (DRAM). The capacitors of the present invention comprise a recessed electrode structure. The present invention also relates to methods of fabricating the capacitors of the present invention.

2. Background of Invention

Capacitors are widely used in integrated circuit devices such as Dynamic Random Access Memory (DRAM) devices. As DRAM devices become more highly integrated, various approaches for increasing the capacitance within a defined cell area have been proposed.

It has been reported that the density of dynamic random-access memory (DRAM) has increased by a factor of 4x every three years during the past 25 years, and this trend continues today. This remarkable increase in density has been brought about by advances in various areas of technology, including lithography, dry patterning, and thin-film deposition techniques, and by improvements in the DRAM architecture resulting in a more efficient cell utilization.

Since DRAM cells contain a single transistor and capacitor and each capacitor must be isolated from adjacent capacitors in the array, only a fraction of the cell area can be occupied by the capacitor.

Higher capacitance density can be achieved by the use of 1) complex electrode structures providing a large surface area within a small lateral area; 2) thinner capacitor dielectrics; and 3) higher-permittivity capacitor dielectric materials. In general, increasing the surface area leads to increased complexity and hence increased cost.

The commonly used silicon dioxide and silicon nitride dielectrics suffer from limitations of their required thicknesses. Accordingly, significant work in recent years has focused on the development of high-permittivity materials for a DRAM capacitor. DRAM chips manufactured to date contain primarily capacitors utilizing a thin dielectric containing a mixture of silicon dioxide and silicon nitride sandwiched between two electrodes made of doped crystalline or polycrystalline silicon. Incorporating a high-permittivity material into a DRAM capacitor drives the need not only for new dielectric materials, but also for new electrode and barrier materials. Thin-film barium-strontium titanate (Ba, Sr) $TiO_3$ (BSTO), with a permittivity in the range 200–350 and a specific capacitance exceeding 125 $fF/\mu m^2$, has been proposed as the leading contender as a dielectric for future DRAMs.

Furthermore, the contact barrier of high dielectric stack capacitors is critical for future generations of DRAM. Currently, the contact barrier used is a TaSiN barrier layer.

Figure 1:
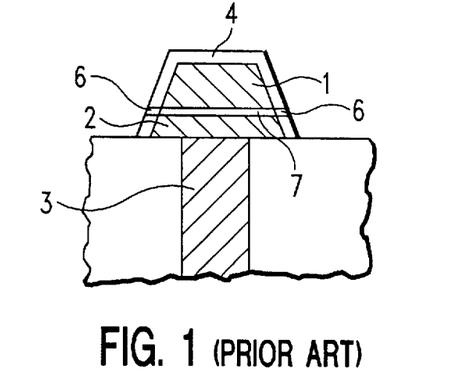
FIG. 1 is a schematic diagram of a typical currently proposed stack capacitor.

A typical structure of a stack capacitor is shown in FIG. 1 wherein 1 represents a lower platinum electrode, 2 represents the TaSiN barrier layer between platinum electrode 1 and plug 3 such as polycrystalline silicon. The dielectric 4 comprises $Ba_{0.7}/Sr_{0.3}TiO_3$ (BSTO). An upper platinum electrode (not shown) will be stacked above lower platinum electrode and BSTO layer 4.

However, during the BSTO deposition, which is carried out in an oxygen environment, TaO and/or SiO is formed at the top of the TaSiN layer. This results in a resistive layer between the Pt and TaSiN, which has a lower capacitance than the BSTO material. There exists two sources of O diffusion. One is from the sidewall as indicated in FIGS. 1 at 6, and the other is from the grain Pt grain boundaries. The sidewall oxygen diffusion can be solved by making a recessed barrier structure, however, the Pt grain boundary problem is not readily abrogated.

SUMMARY OF INVENTION

The present invention addresses the problem of oxygen diffusion through the electrode. The present invention provides a recessed electrode structure which interrupts the grain boundaries of the electrode while also protecting against side wall diffusion.

More particularly, the present invention relates to a capacitor structure which comprises a top electrode and a bottom electrode, wherein the bottom electrode is from depositing a first electrode portion which is recessed with respect to electric insulator on the sidewalls thereof and depositing a second electrode portion; and wherein dielectric is present on the sidewalls and top of the second electrode portion of the bottom electrode; and wherein the top electrode is located above the dielectric.

A further aspect of the present invention relates to a semiconductor structure which comprises the above-disclosed capacitor structure located above a conductive plug and a barrier layer located between the conductive plug and capacitor structure.

A still further aspect of the present invention relates to a semiconductor structure which comprises the capacitor structure disclosed above located above an electrode contact line and a conductive plug in contact with the electrode contact line.

The present invention also relates to a method for fabricating an electrode for a capacitor structure. The method comprises depositing a first electrode layer onto a surface, depositing a protective layer on top of the first electrode layer to form a stacked structure;

patterning the stacked structure;

depositing and polishing electrical insulator layer to provide insulator on the sidewalls of the stacked structure;

removing the protective layer by etching;

recessing the first electrode layer with respect to the electrical insulator;

depositing a second electrode layer on top of the first electrode layer and patterning the second electrode layer; and depositing a dielectric layer on top of and on the sidewalls of the second electrode layer.

A still further aspect of the present invention is concerned with an electrode obtained by the above-disclosed process.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference is made to the figures wherein the same numeral in different figures refers to the same or equivalent structure.

Figure 2:
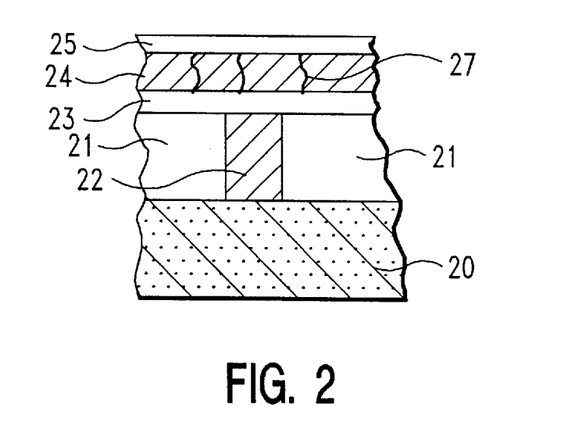
FIGS. 2–7 are schematic diagrams of a capacitor of the present invention during various stages of fabrication.

In FIG. 2, an insulating material 21 such as silicon dioxide is formed on a semiconductor substrate 20. Contact holes are formed through the insulating material 21 by etching selectively as determined by photolithographic technique as known in the art. The inside of the contact holes is filled with conductive plugs 22 by depositing a conductive material such as doped polycrystalline silicon or $WSi_x$ on the structure and then etching back the deposited conductive material to provide a planar surface on the electrical insulating material 21.

A barrier layer 23 such as a metal nitride or metal silicon nitride is deposited on the insulating layer 21. Examples of barrier layers include TiN, TaN, TiAlN, TaAlN, mixtures thereof and preferably TaSiN. Of course, if desired, layer 23 can comprise a plurality of different layers. The TaSiN can be deposited by chemical vapor deposition or reactive sputtering in $Ar/N_2$ with a TaSi target. The barrier layer 23 is preferably a contact barrier layer comprising a bottom silicide layer such as Ta and/or Ti silicide, and above the silicide layer a metal nitride or metal silicon nitride as disclosed above. The silicide layer acts as an electrical contact to the plug 22 and the nitride layer acts as a barrier to the electrode material. The barrier layer 23 is typically about 5 nanometers to about 100 nanometers, and more typically about 30 nanometers thick. When a plurality of layers are used for the layer 23, their total, thickness is typically within the above amounts. For example, when two layers are employed each accounts for about one half of the total thickness.

Next, a first electrode layer 24 is deposited on the barrier layer such as by sputtering. The first electrode layer 24 is typically about 5 to about 200 nanometers and more typically about 20 nanometers to about 100 nanometers thick. Numeral 27 illustrates grain boundaries through the platinum layer 24. Examples of suitable electrode materials are Pt, Ir, Ru, Pd, $IrO_2$, and $RuO_2$. A plurality of different electrode layers can be employed, if desired. The preferred electrode layer 24 is platinum or comprises bottom Ir layer and a top $IrO_2$ layer.

A protective or hard mask layer 25 such as TiN is deposited on the first electrode layer 24 such as by sputtering. The protective layer 25 is typically about 5 nanometers to about 100 nanometers and more typically about 10 nanometers to about 30 nanometers thick.

Figure 3:
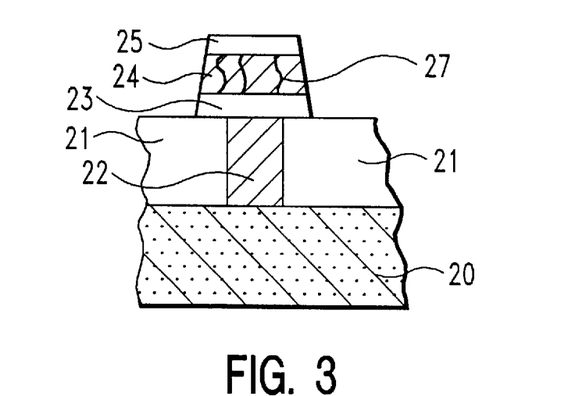

As illustrated in FIG. 3, the stack of the barrier layer 23, first electrode layer 24 and protective layer 25 is patterned by reactive ion etching with the protective layer 25 acting as a hard mask for the electrode layer 24 and the barrier layer 23. The etching is typically carried out by reactive ion etching.

Figure 4:
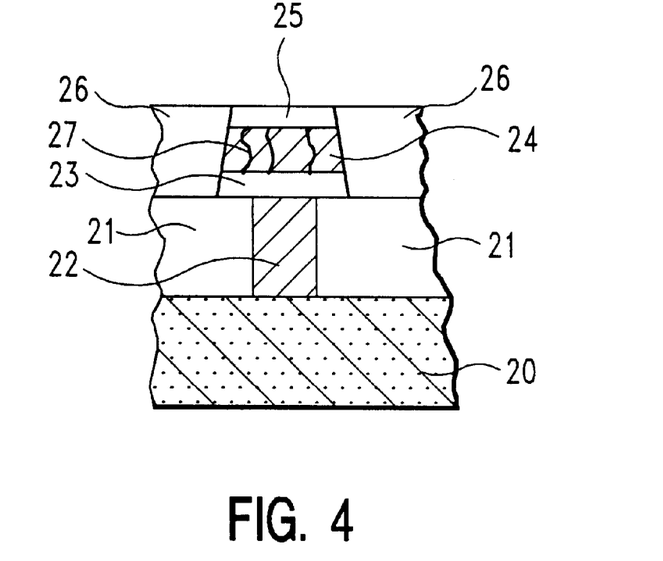

FIG. 4 illustrates depositing an insulator layer 26 such as silicon dioxide and/or silicon nitride by chemical vapor deposition followed by chemical mechanical polishing (CMP) to provide a planar structure.

Figure 5:
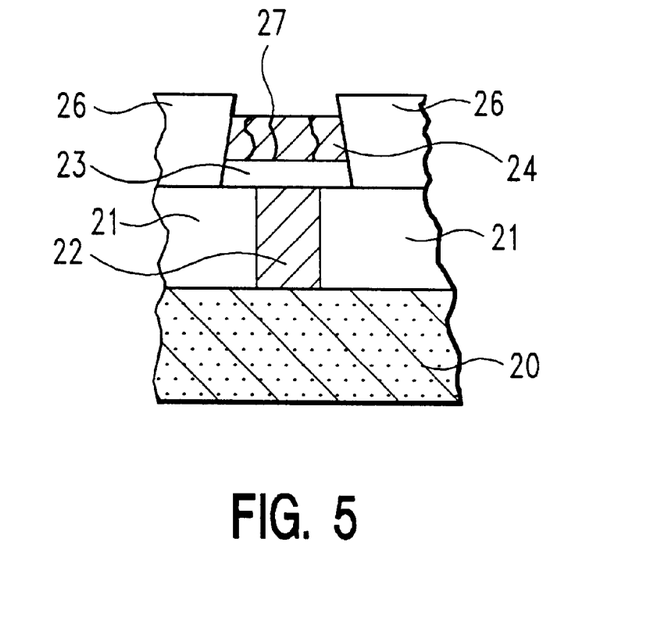

FIG. 5 illustrates the structure according to the present invention achieved by selectively etching away the protective layer 25. The layer 25 can be etched by reactive ion etching or wet chemical etching. The selective etching of the protective layer 25 results in having the first electrode layer 24 recessed with respect to the insulator layer 26. In other words, the top surface of the first electrode layer 25 is recessed with respect to the top of the insulator layer 26.

Figure 6:
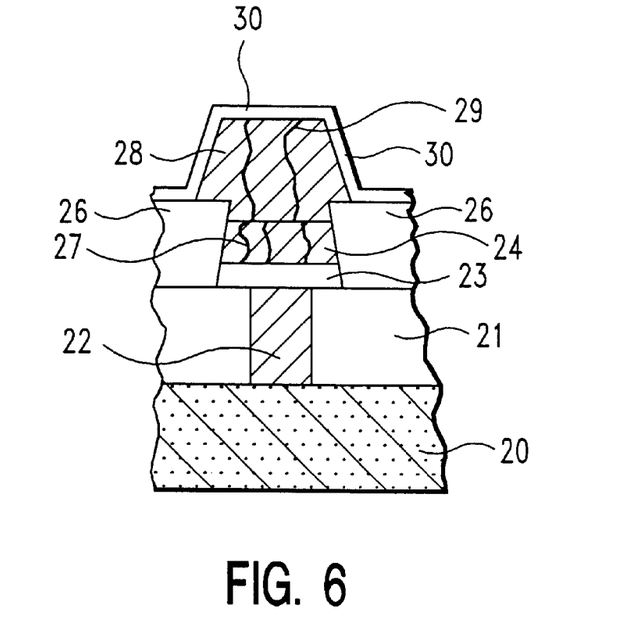

In FIG. 6, a second electrode layer 28 is deposited to complete the lower electrode that comprises the first and second electrode layers 24 and 28. Numeral 29 represents grain boundaries in layer 28. The second electrode layer 28 is typically about 100 nanometers to about 600 nanometers and more typically about 250 nanometers to about 350 nanometers thick.

The multistep deposition of the electrode creates a greater distance for oxygen to pass through grain boundaries since the grain boundaries in layer 24 will not be aligned with those in layer 28 as schematically illustrated in FIG. 6.

The insulator layer 26 protects against oxygen diffusion through sidewalls of the electrode. In addition, a dielectric layer 30 is conformally deposited to cover the top and sidewalls of the layer 28. Dielectric layer 30 is typically a high dielectric constant material such as BSTO ($BaSrTiO_3$), STO ($SrTiO_3$), PZT ($PbZrTiO_3$), $BaTiO_3$, $PbTiO_3$ or $Bi_4Ti_3O_{12}$, and is preferably BSTO. BSTO is typically deposited by metal-organic chemical vapor deposition (MOCVD). Films of $(Ba,Sr)TiO_3$ can be deposited by MOCVD using liquid delivery of the precursors. $Ba(thd)_2$(4-glyme), $Sr(thd)_2$(4-glyme), and $Ti(O-iPr)_2(thd)_2$ are typically used as the organic sources. The dielectric layer can also be a ferroelectric material.

The deposition typically takes place in an oxygen environment at temperatures in the range of 450–700° C. The high-permittivity dielectric conformally coats the bottom electrode.

The conductive barrier layer 23 is used to separate the electrode from the plug material to help prevent electrode-plug interdiffusion and reaction, and to protect the plug against oxygen exposure during this deposition and to provide an electrical contact from the plug material 22 to the electrode material 24.

Dielectric layer 30 is typically about 5 nanometers to about 100 nanometers, and more typically about 10 nanometers to about 50 nanometers thick.

Figure 7:
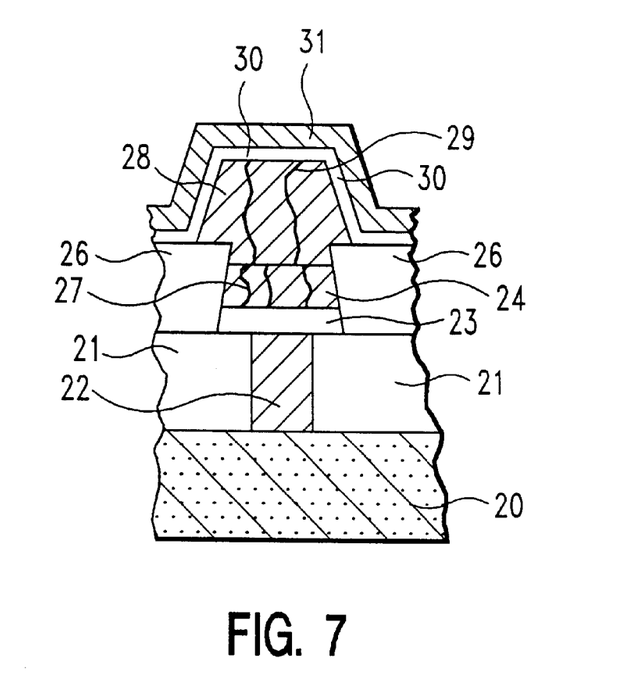

FIG. 7 shows the conformally deposition of the upper electrode 31. The upper electrode layer 31 is typically about 30 nanometers to about 200 nanometers and more typically about 50 nanometers to about 100 nanometers thick.

Reference to bottom and top electrodes and similar terms refers to their respective relationship to conductive plug or similar structure with the bottom electrode being the closer of the electrodes to the conductive plug. Such terms are not intended to imply actual orientation of the electrode layers in a structure.

FIGS. 8–13 illustrate another embodiment of the present invention. In particular, in FIG. 8 an insulating material 21 such as silicon dioxide is formed on a semiconductor substrate 20. Contact holes are formed through the insulating material 21 by etching selectively as determined by photolithographic technique as known in the art. The inside of the contact holes is filled with conductive plug 22 by depositing a conductive material such as doped polycrystalline silicon or $WSi_x$ on the structure and then etching back the deposited conductive material to provide a planar surface on the electrical insulating material 21.

Figure 8:
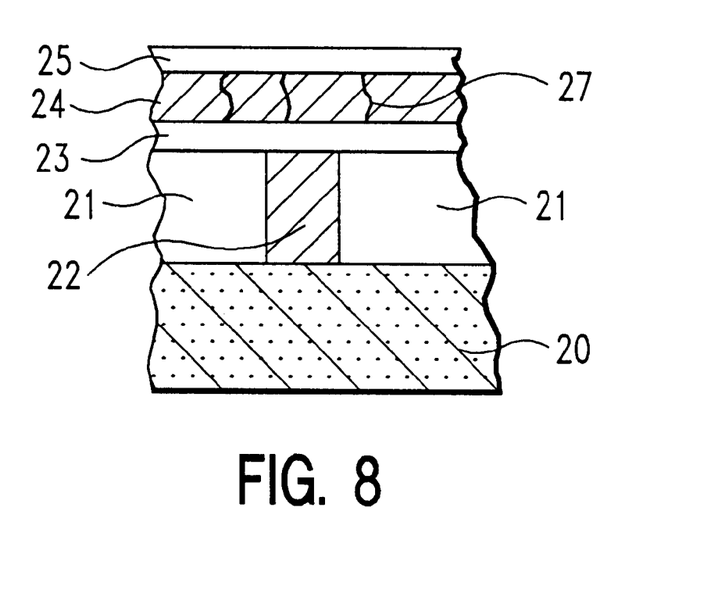
FIGS. 8–14 are schematic diagrams of another capacitor structure according to the present invention during various stages of fabrication.

A barrier layer 23 such as a metal nitride or metal silicon nitride is deposited on the insulating layer 21. Examples of barrier layers include TiN, TaN, TiAlN, TaAlN and preferably TaSiN.

The TaSiN can be deposited by chemical vapor deposition or reactive sputtering in $Ar/N_2$ with a TaSi target. The barrier layer 23 is typically about 5 nanometers to about 100 nanometers, and more typically about 30 nanometers thick.

Next, a first electrode layer 24 is deposited on the barrier layer such as by sputtering. The first electrode layer 24 is typically about 5 nanometers to about 200 nanometers and more typically about 20 nanometers to about 100 nanometers thick. Numeral 27 illustrates grain boundaries through the electrode layer 24.

A protective or hard mask layer 25 such as TiN is deposited on the first electrode layer 24 such as by physical vapor deposition. The protective layer 25 is typically about 5 nanometers to about 100 nanometers and more typically about 10 nanometers to about 30 nanometers thick.

Figure 9:
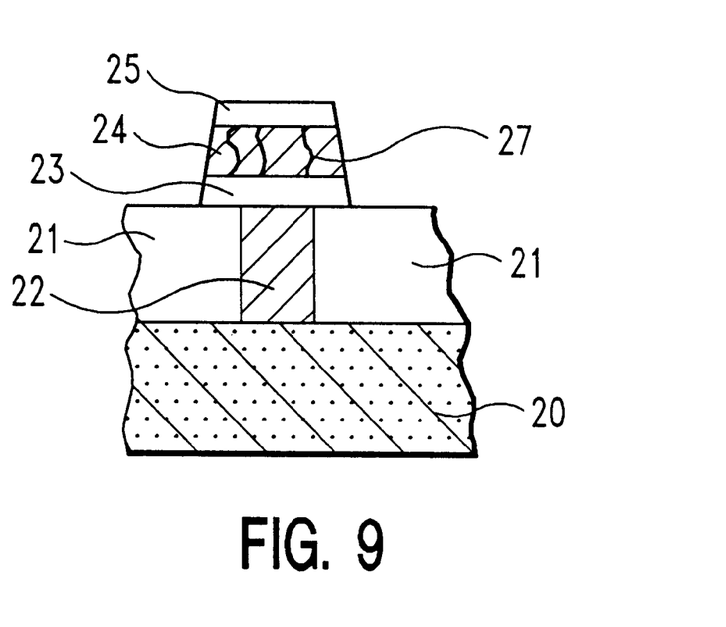

As illustrated in FIG. 9, the stack of the barrier layer 23, first electrode layer 24 and protective layer 25 is patterned by reactive ion etching with the protective layer 25 acting as a hard mask for the electrode layer 24 and the barrier layer 23.

Figure 10:
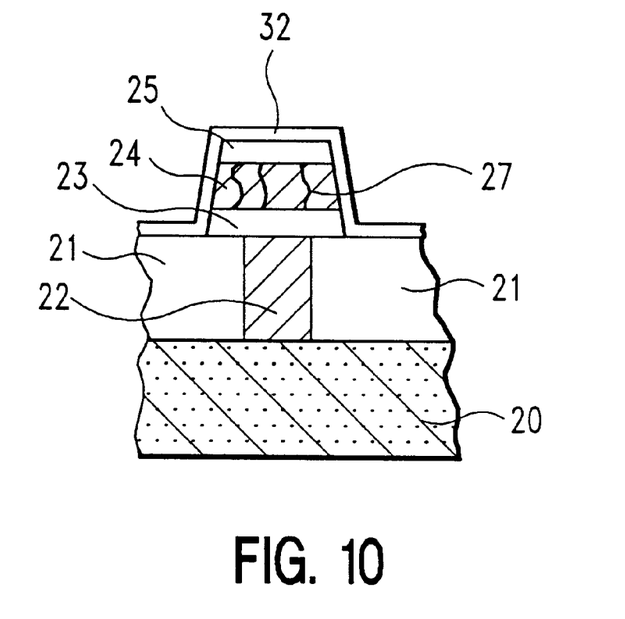

FIG. 10 illustrates conformally depositing a silicon nitride ($SiN_x$) dielectric layer 32 such as by chemical vapor deposition. The silicon nitride layer 32 is typically about 20 nanometers to about 60 nanometers, and more typically about 30 nanometers to about 50 nanometers thick. The silicon nitride provides for excellent blocking of the oxygen diffusion. However, the stress of $SiN_x$ is quite large, which may cause crack between the electrode material and $SiN_x$ at the sidewalls which may create a pathway for O diffusion. Therefore, a thin $SiN_x$ layer is used to cover the sidewalls before filling with the dielectric 26 such as $SiO_2$. In this way, $SiN_x$ acts as a protective layer against both oxygen diffusion from porous $SiO_2$ and against a reaction between the electrode material and $SiO_2$ during the $SiO_2$ deposition.

Figure 11:
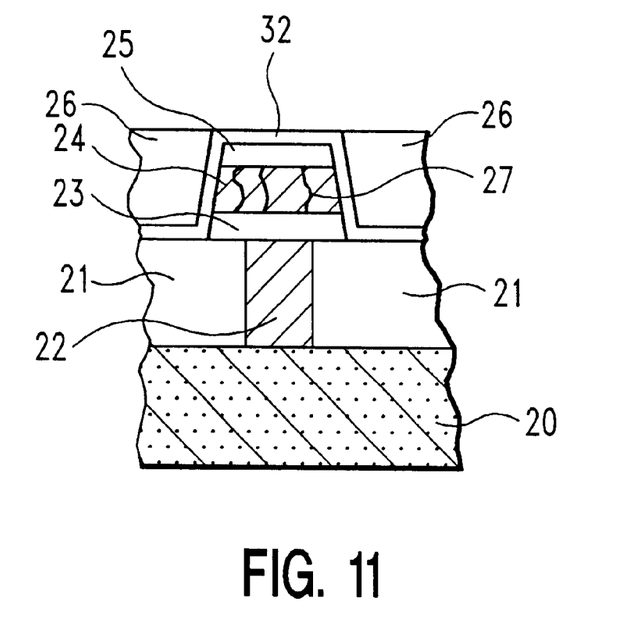

FIG. 11 illustrates depositing an electrical insulator layer 26 such as silicon dioxide by chemical vapor deposition (CVD) followed by chemical vapor deposition followed by chemical mechanical polishing (CMP) to provide a planar structure.

Figure 12:
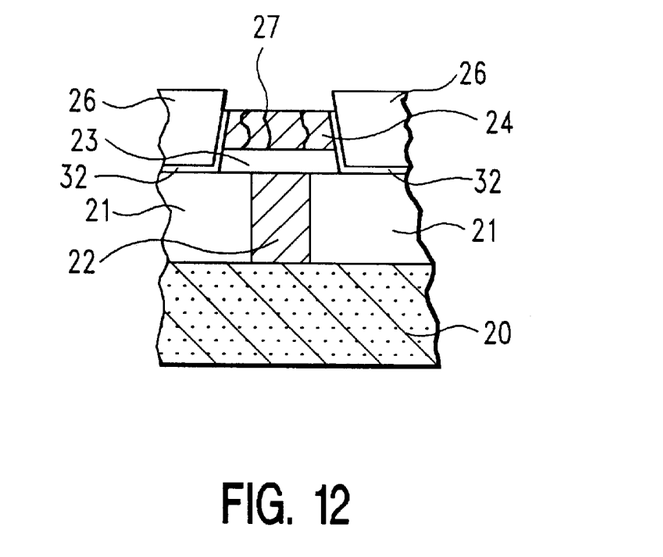

FIG. 12 illustrates the structure according to the present invention achieved by selectively etching away the top portion of $SiN_x$ layer 32 and protective layer 25. The layers 32 and 25 can be etched by reaction ion etching or wet chemical etching.

The selective etching of the top portion of $SiN_x$ layer 32 on top of protective layer 25 and of the protective layer 25 results in having the first electrode layer 24 recessed with respect to the insulator layer 26. In other words, the top surface of the first electrode layer 24 is recessed with respect to the top of the insulator layer 26.

Figure 13:
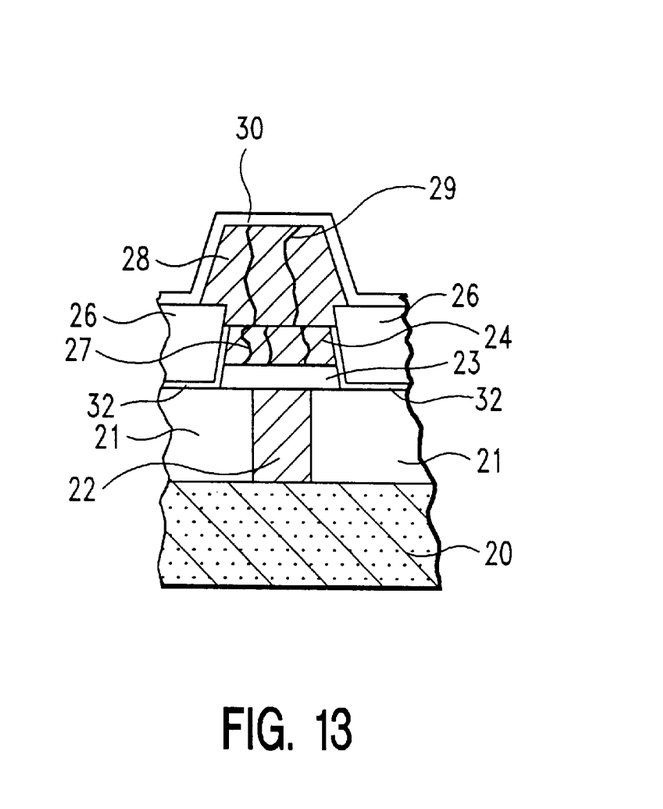

In FIG. 13, a second electrode layer 28 is deposited and patterned to complete the lower electrode that comprises the first and second electrode layers 24 and 28. Numeral 29 represents grain boundaries in layer 28.

The insulator layer 26 protects against oxygen diffusion through sidewalls of the electrode. In addition, a dielectric layer 30 is conformally deposited to cover the top and sidewalls of the electrode layer 28. Dielectric layer 30 is a high dielectric constant material such as BSTO ($BaSrTiO_3$), STO ($SrTiO_3$), PZT ($PbZrTiO_3$), $BaTiO_3$, $PbTiO_3$ or $Bi_4Ti_3O_2$, and is preferably BSTO. BSTO is typically deposited by metal-organic chemical vapor deposition (MOCVD). Films of $(Ba,Sr)TiO_3$ can be deposited by MOCVD using liquid delivery of the precursors. $Ba(thd)_2$(4-glyme), $Sr(thd)_2$(4-glyme), and $Ti(O-iPr)_2(thd)_2$ are typically used as the organic sources. The dielectric layer 30 can also be a ferroelectric material.

The deposition typically takes place in an oxygen environment at temperatures in the range of 450–700° C. The high-permittivity dielectric conformally coats the bottom electrode.

The conductive barrier layer 23 is used to separate the electrode from the plug material to help prevent electrode-plug interdiffusion and reaction, and to protect the plug against oxygen exposure during this deposition and to provide electrical contact to the plug.

Dielectric layer 30 is typically about 5 nanometers to about 100 nanometers, and more typically about 10 nanometers to about 50 nanometers thick.

Figure 14:
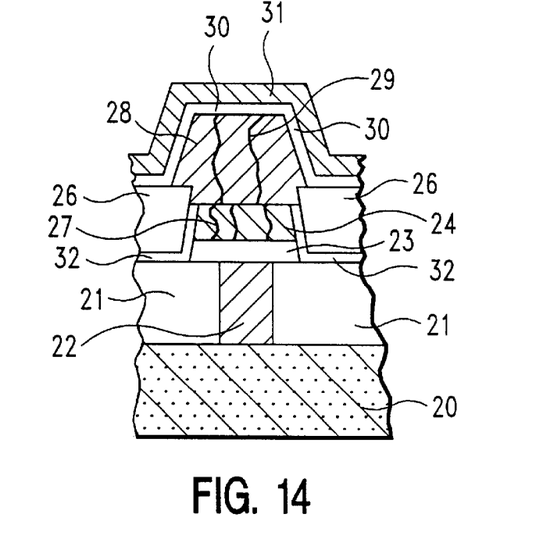

FIG. 14 shows the conformally deposition of the upper electrode 31. The upper electrode layer 31 is typically about 30 nanometers to about 200 nanometers and more typically about 50 nanometers to about 100 nanometers thick.

Figure 15:
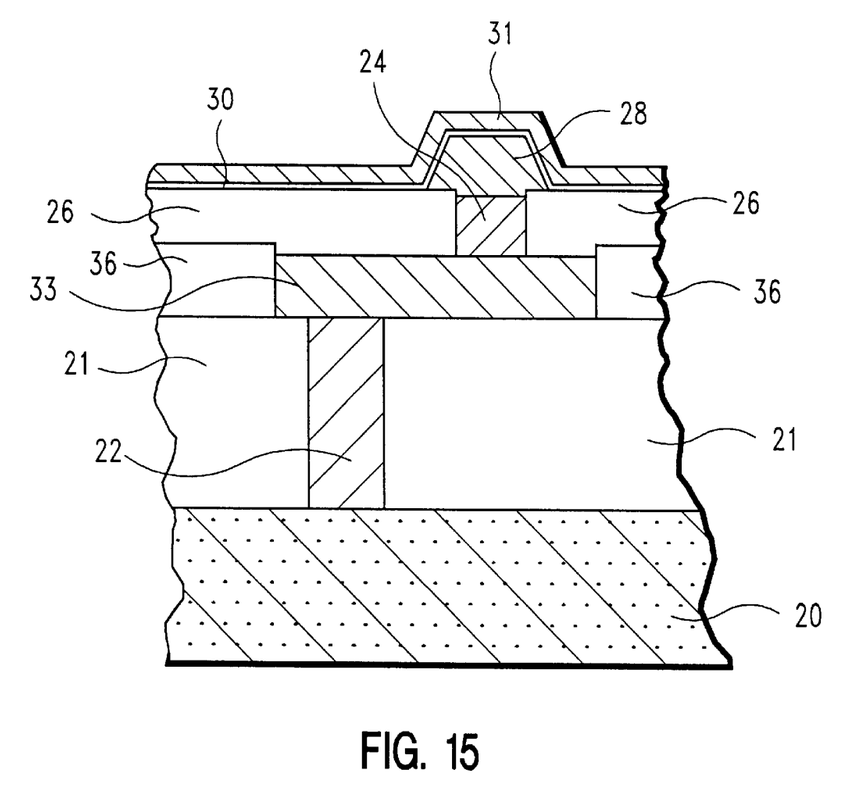
FIG. 15 is a schematic diagram of another structure according to the present invention.

FIG. 15 illustrates another embodiment of the present invention employing a stack capacitor located at a location other than the plug contact. In particular, FIG. 15 illustrates an insulating material 21 such as silicon dioxide on a semiconductor substrate 20. A conductive contact plug 22 such as doped polycrystalline silicon or $WSi_x$. An electrode metal line contact 33 contacts the contact plug 22 and is protected by insulator 36. A barrier layer 23 is located between the electrode line contact 33 and the plug 22. The lower electrode of the capacitor comprises electrode layers 24 and 28 with layer 24 in contact with line 33. The sidewalls of lower electrode are protected by insulator layer 26. Dielectric layer 30 covers the top and sidewalls of layer 28 and separates the upper electrode 31. The electrode material for 33, 24, 28 and 31 can typically be any of the electrode disclosed hereinabove.

Although the electrode line resistance such as for a platinum line is higher than Al or Cu line resistance because of its oxidation resistance, it can be used in devices where high oxidation is required such as high dielectric stack capacitors. In addition, this an electrode line can also be used in the merger logic devices, where stack capacitor could be located at the location other than the plug contact. Since the oxygen diffusion path is increased it is less likely that oxygen will reach the barrier layer.

Figure 16:
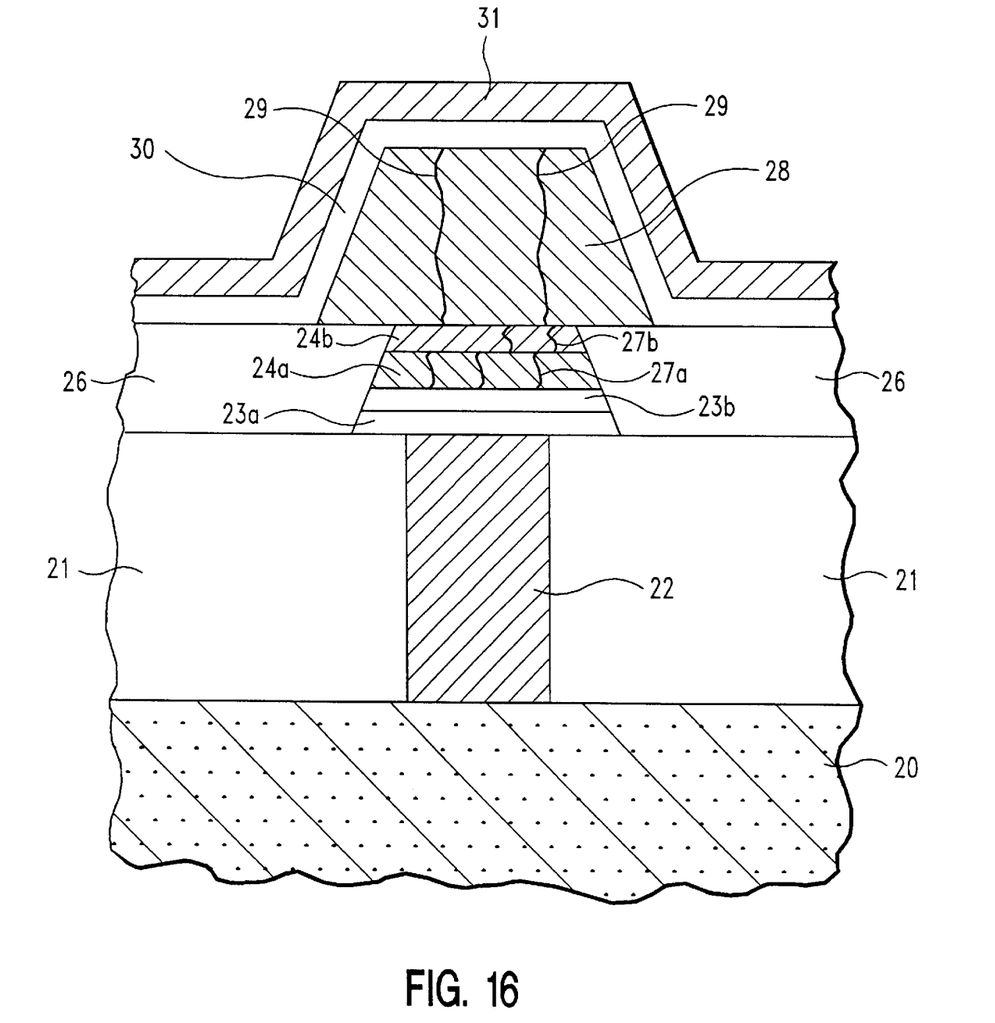
FIG. 16 is a schematic diagram of another structure according to the present invention.

FIG. 16 is a schematic diagram of a preferred structure according to the present invention. In particular, an insulating layer 21 such as silicon dioxide is located on a semiconductor substrate 20. A conductive plug 22 such as poly crystalline silicone is present. The barrier layer is a contact barrier layer comprising contact layer 23a of TaSi and barrier 23b of TaSiN. The lower electrode of the capacitor comprises a bottom electrode material comprising Ir layer 24a and $IrO_2$ layer 24b and a top electrode layer 28 of platinum. The upper electrode 31 of the capacitor comprises platinum. Dielectric layer 30 covers the top and sidewalls of layer 28 and separates the upper platinum electrode 31. Layer 30 is preferably BSTO.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for fabricating an electrode for a capacitor structure which comprises depositing a first electrode layer onto a surface of a barrier layer, depositing a protective layer on top of the first electrode layer to form a stacked structure;

patterning the stacked structure;

depositing an electrical insulator layer over the stacked structure and then polishing the electrical insulator layer to provide insulator on the sidewalls of the stacked structure;

removing the protective layer by etching;

recessing the first electrode layer with respect to the insulator;

depositing and patterning a second electrode layer on top of the first electrode layer; and depositing a dielectric layer on top of and on the sidewalls of the second electrode layer.

2. The method of claim 1 wherein the insulator on the sidewalls of the first electrode portion comprises silicon dioxide.

3. The method of claim 1 wherein the dielectric on sidewalls of the second electrode portion comprises BaSrTiO$_3$.

4. The method of claim 1 wherein the first electrode portion is about 5 nanometers to about 200 nanometers thick.

5. The method of claim 4 wherein the second electrode portion is about 100 nanometers to about 600 nanometers thick.

6. The method of claim 1 wherein insulator on sidewalls of the first electrode portion comprises silicon nitride contacting the sidewalls and layer of silicon dioxide on the silicon nitride.

7. The method of claim 6 wherein the silicon nitride is about 20 nanometers to about 60 nanometers thick.

8. The method of claim 1 which further comprises depositing a further electrode on top of the dielectric layer on top of the second electrode layer.

9. The method of claim 1 wherein the surface is a barrier layer.

10. The method of claim 9 wherein the barrier layer comprises TaSiN.

11. The method of claim 9 wherein the barrier layer comprises a bottom contact layer of a silicide and a top barrier nitride layer.

12. The method of claim 11 wherein the silicide comprises Ta silicide and the nitride layer comprises TaSiN.

13. The method of claim 1 wherein the surface is a electrode line.

14. An electrode obtained by the process of claim 1.

15. The method of claim 1 wherein the patterning of the second electrode layer provides for the second electrode layer to overlap portions of the electrical insulator layer.

* * * * *